United States Patent
Song et al.

(10) Patent No.: US 6,816,990 B2
(45) Date of Patent: Nov. 9, 2004

(54) VLSI CHIP TEST POWER REDUCTION

(75) Inventors: Peilin Song, Lagrangeville, NY (US); Timothy J. Koprowski, Newburgh, NY (US); Ulrich Baur, Weil In Schoenbuch (DE); Franco Motika, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 10/058,485

(22) Filed: Jan. 28, 2002

(65) Prior Publication Data

US 2003/0145263 A1 Jul. 31, 2003

(51) Int. Cl.[7] .............................................. G01R 31/28
(52) U.S. Cl. ...................................... 714/729; 714/739
(58) Field of Search ................................. 714/729, 726, 714/738, 739, 741, 742, 30

(56) References Cited

U.S. PATENT DOCUMENTS

| | | | | |
|---|---|---|---|---|
| 4,801,870 A | * | 1/1989 | Eichelberger et al. | 714/736 |
| 5,239,262 A | * | 8/1993 | Grutzner et al. | 714/733 |
| 5,968,194 A | * | 10/1999 | Wu et al. | 714/726 |
| 6,671,838 B1 | * | 12/2003 | Koprowski et al. | 714/726 |

* cited by examiner

*Primary Examiner*—Christine T. Tu
(74) *Attorney, Agent, or Firm*—Lynn L. Augspurger; James E. Murray

(57) ABSTRACT

LBIST and weighted LBIST tests are performed simultaneously on different portions of the tested object. This new test methodology and design change achieves the same test coverage and test time as the traditional test strategy with dramatic power reduction during test. It can be applied at wafer, chip, MCM, and system levels of test. Most importantly, it does not need new tools for support. Current test software will work as it does with the traditional test strategy. Scheduling the LBIST and weighted LBIST tests in the same test session reduces the overall power consumption because weighted LBIST testing consumes much less power than flat LBIST testing. In the same test session, if some parts of the logic is tested using weighted LBIST while the others were tested using LBIST, the power consumed by the circuit element at any given time is reduced.

12 Claims, 5 Drawing Sheets

VLSI CHIP TEST POWER REDUCTION

FIELD OF THE INVENTION

The present invention relates to testing of complex combinatorial and sequential logic circuits embodied in large scale integration (LSI) and very large scale integration (VLSI) circuit devices and more particularly, to the reduction of power dissipation and heating of circuit elements during testing.

BACKGROUND OF THE INVENTION

A fault occurring anywhere in a LSI or VLSI circuit device can have its effect propagated through a number of feedback loops including storage or memory elements in the sequential logic before reaching a testable output of the device. Level sensitive scan design (LSSD) rules were devised to eliminate the complications in testing caused by this propagation through feedback loops. As described by E. B. Eichelberger and T. W. Williams in an article entitled "A Logic Design Structure for LSI Testability" on pages 462–468 of the Proceedings of the 14th Design Automation Conf, LSSD rules impose a clocked structure on logic circuit memory elements such as latches and registers, and require these memory elements be tied together to form a shift register scan path so that they are accessible for use as test input and output points. Therefore, test input signals can be introduced or test results observed wherever one of the memory elements occurs in the logic circuit. Being able to enter the logic circuit at any memory element for introducing test signals or observing test results, allows the combinational and sequential logic to be treated as much simpler combinational logic for testing purposes thus considerably simplifying test generation and analysis. Patents describing LSSD techniques include U.S. Pat. Nos. 3,783,254; 3,784,907; 3,961,252, 4,513,418 and 5,983,380. The subject matter of these patents and the above described Eichelberger and Williams article are hereby included by reference.

Self-testing has been employed in connection with LSSD to reduce the volume of text patterns and time it takes to generate the test patterns and to perform the testing. Self-testing involves the use of pseudo-random pattern generators and response compression structures that are built into logic circuit devices. Using such pattern generators and compression structures eliminates the computer time needed to generate the tests and placing these testing elements on the device containing the logic allows the application of vast numbers of test patterns to the circuits in a high ratio and in a reasonable period of time.

In the aforementioned U.S. Pat. No. 5,983,380, the shift register latches (SRLs) in the LSSD scan paths perform both input data launching and output data capturing. The test patterns come from the scan path that is configured into a linear feedback shift register (LFSR). The test data is then outputted into a multiple input shift register (MISR) for data compression. Alternate scan path shift cycles are applied to the SRLs exercising the combinational logic with the contents of the SRLs and capturing the results of the response back into the SRLs where they can be used as test inputs for the next cycle. At the end of a calculated number of cycles, the contents of the scan path are read out as the signature to be compared with the desired value. Such self-testing is referred to as Logic Built-In Self-Test (LBIST).

Two types of LBIST tests are applied during self test. One type is the LBIST test and another is the weighted LBIST test. As shown in FIG. 1, the LBIST and weighted LBIST tests are performed sequentially with the weighted LBIST test usually following the LBIST test. One problem with this test strategy is that the AC power consumption during LBIST can be very high and as more and more devices are included in the design, the heating of circuit elements will become a severe problem. There are two factors of power consumption during test. One is during the scan session where logic switching activities occurs while loading the scan chain with random patterns. The other is during the test cycle where system clocks are applied. In LBIST, the typical test patterns used make the chip function at 50% switching activity per system clock, which can cause a large power supply droop during high speed testing since the power consumption is proportional to the summation of switching activities of individual devices.

BRIEF DESCRIPTION OF THE INVENTION

In accordance with the present invention, the flat LBIST and weighted LBIST test patterns are simultaneously provided different portions of the tested circuit element. This new test methodology and design change achieves the same test coverage and test time as the traditional test strategy with dramatic power reduction during test. It can be applied at wafer, chip, multi chip module (MCM), and system levels of test. Most importantly, it does not need new tools for support. Current test software will work as it does with the traditional test strategy. Scheduling the LBIST and weighted LBIST tests in the same test session reduces the power consumption (watts) because weighted LBIST pattern testing consumes much less power than flat pattern LBIST testing. In the same test session, if some parts of the logic is tested using weighted LBIST while the others were tested using LBIST, the power consumed by the circuit element at any given time is reduced.

Therefore, it is an object of the present invention to provide improved LSSD testing methods and apparatus.

It is another object of the present invention to provide for more efficient testing of logic circuits.

It is a further object of the invention to provide improved testing procedures.

BRIEF DESCRIPTION OF THE DRAWINGS

These and other objects of the invention can best be understood reading the following description of the described embodiments thereof while making reference to the accompanying figures of which.

DETAILED DESCRIPTION OF THE INVENTION

Figure 2:
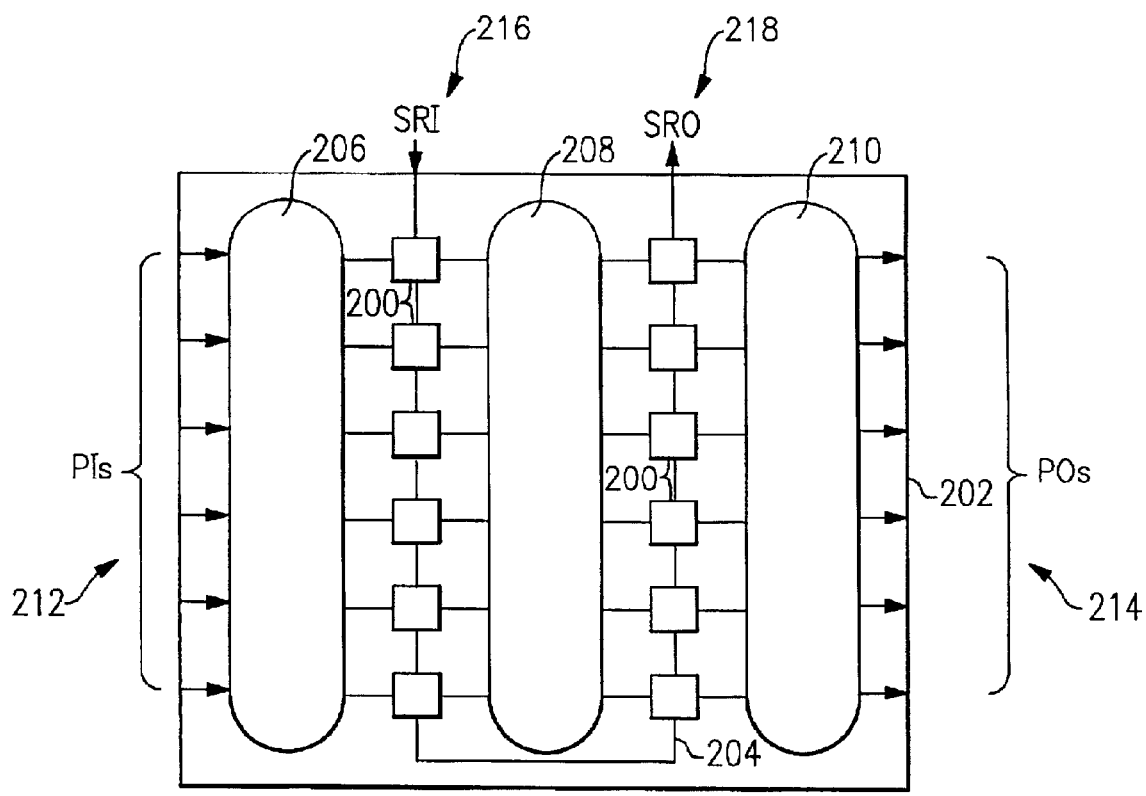
FIG. 2 is a schematic diagram of a VSLI logic chip with SRLs arranged in a LSSD chain.

FIG. 2 shows that in accordance with LSSD rules, shift register latches (SRL's) 200 on a semiconductor chip 202 are joined together to form a shift register LSSD scan latch chain 204 to facilitate testing of combinational logic blocks 206, 208 and 210 interconnected by the SRLs 200 of the scan latch chain 204. During circuit operation data is inputted to the combinational logic blocks 206, 208 and 210 and the SRLs 200 in a parallel through the primary inputs (PIs) 212 of the chip 202 and data is outputted from the combinational logic blocks 206, 208 and 210 and the SRLs 200 in parallel through the primary outputs (POs) vectors 214 of the chip 202. During testing, the scan chain latch circuits 204 can also be loaded serially. Serial input (SRI) 216 provides a serial input to the scan chain latch circuits 204 and serial output (SRO) 218 provides an output from scan chain latch circuits 204. Scanning inputs into the serial input SRI 216 and out serial input 218 enables testing the SRLs 204 independently of the combinational logic 206, 208 and 210. It also allows each of the individual SRLs to be used as a pseudo-primary input or a pseudo-primary output for a combinational logic block 206, 208 or 210. The logic circuits in each of the logic blocks to be tested separately of circuits in other of the logic blocks. (While a single scan latch chain is shown here, it should be understood that it applies equally as well to latches arranged in multiple scan chains on the chip.)

Figure 3:
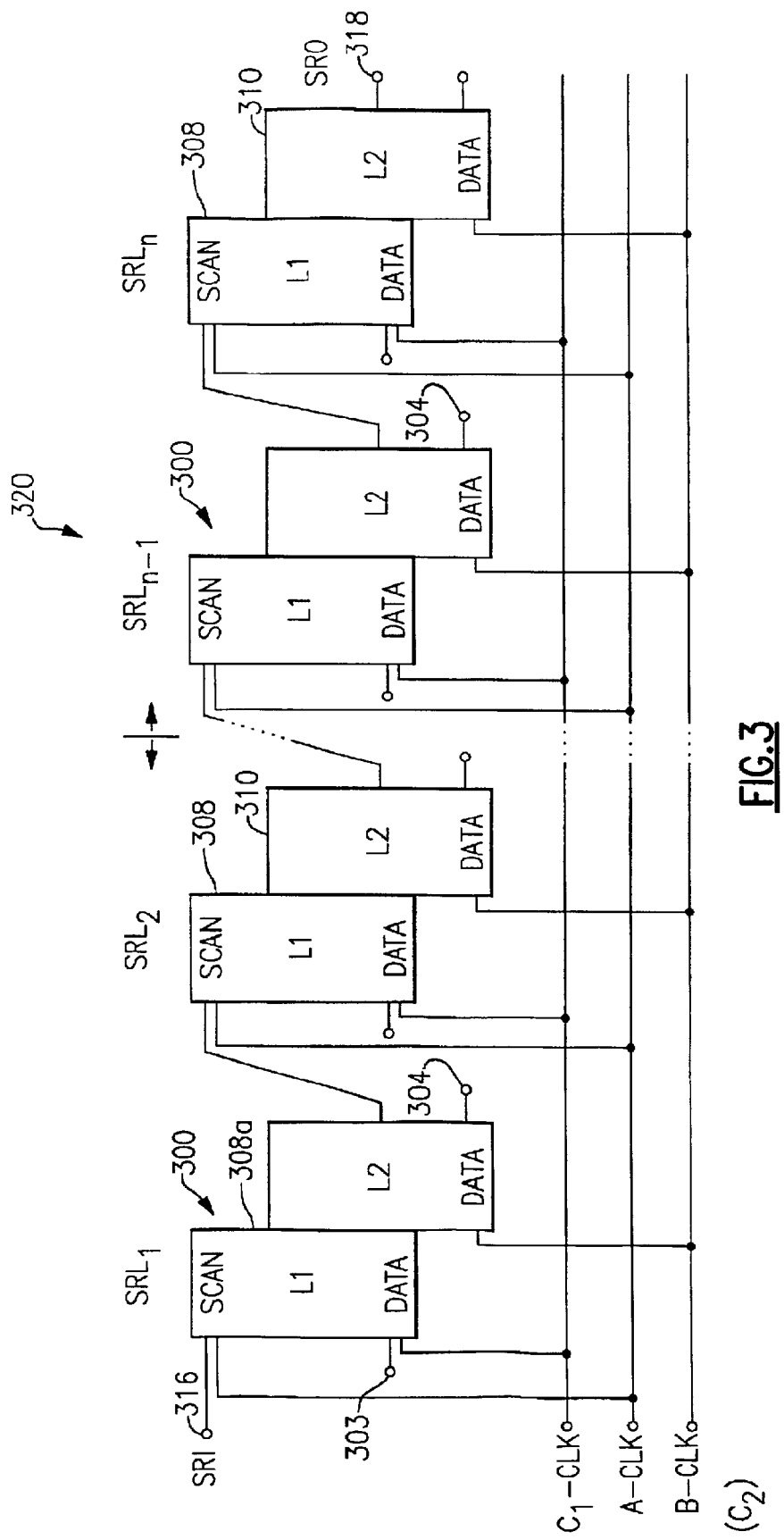
FIG. 3 is a schematic diagram of the SRL latches in the LSSD chain of FIG. 2.

FIG. 3 shows a more detailed view of a LSSD scan chain circuit 300. This chain circuit comprises a plurality of shift register latches (SRLs) 300 (herein designated as $SRL_1$, $SRL_2$, ..., $SRL_{N-1}$, $SRL_N$) in which each SRL 300 includes a master latch 308 and a slave latch 310. For transfer of data between the latches and combinatorial logic 206, 208 and 210 shown in FIG. 1, each of the SRLs 300 contains a data input terminal 302 from combinatorial logic circuits and a data output terminal 304 to the combinatorial logic circuits. In addition, data can be introduced into the latches at shift register input (SRI) terminal 316 and transferred from one SRL to another to the shift register output (SRO) terminal. As described below, data is clocked into each SRL 300 by applying a clock pulse to master latch 308, and data is clocked out of each SRL 300 by applying a clock pulse to slave latch 310. Data is output from slave latch 310 to a succeeding master latch 308. For this purpose, the operation of the LSSD scan chain 320 is controlled by scan clock signals on the a-clk, b-clk and c-clk lines. Serial loading of the master latch 308a from the SRL 116 occurs upon generation of an a-elk pulse on a-clk line. The a-clk pulse on a-clk line causes serial input applied to the SRLs 300 to be inputted to each master latch 308. Application of a b-clk on b-clk line causes data to be output from the SRLs via slave latches 310. The continuous, alternating application of a-clk and b-clk clock pulse signals on the a-clk and b-clk lines respectively sequentially propagates a data signal applied to SRI terminal 316 through scan chain 320 to SRO terminal 318. To effect a parallel load, a $c_1$-clk block pulse is applied to $c_1$-clk line. This causes a parallel load of data via parallel data inputs 302 and combinational logic to each master latch 308 of the SRLs 300. Application of a b-clk or $c_2$-clk pulse to the b-clk line causes a parallel output of data from each slave latch 310 of SRLs 300 to provide data on respective parallel output data lines 304.

Figure 4:
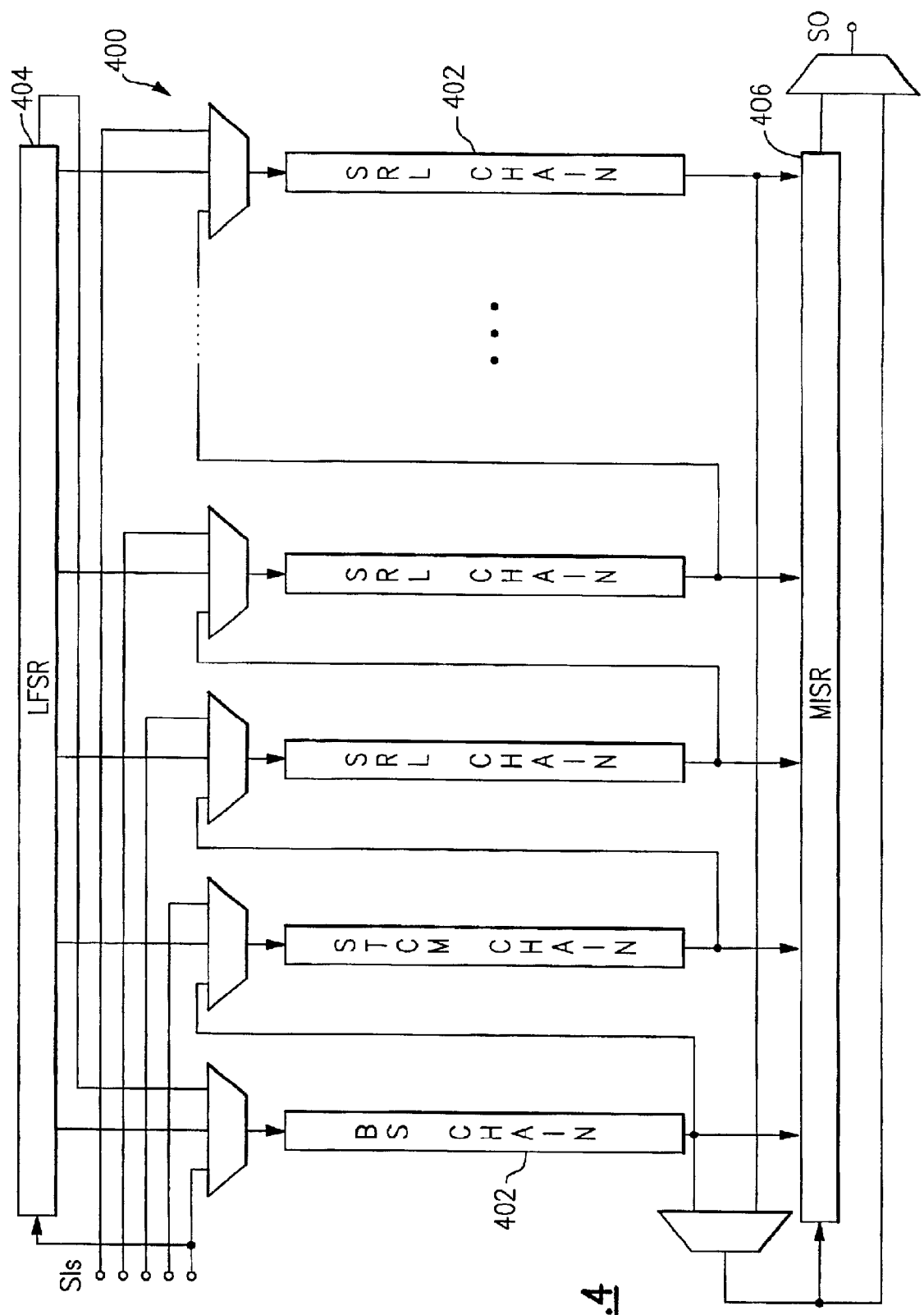
FIG. 4 is a schematic diagram of a LBIST test circuit capable of performing both LBIST and weighted LBIST testing.

As previously mentioned, self-testing is employed in connection with LSSD to reduce the time it takes to generate the test patterns and to perform the testing. Self-testing involves the use of pseudo-random pattern generators and response compression structures that are built into logic circuit devices. Using such pattern generators and response compression structures eliminates the computer time needed to generate the tests while placing these testing elements on the device containing the logic allows the application of vast numbers of test patterns to the circuits in a reasonable period of time. FIG. 4 shows a typical configuration for a logic built-in self test (LBIST) circuit 400, shown in the above mentioned Molika U.S. Pat. No. 5,983,380. In that LBIST circuit, SRLs in the SRL chains 402 perform both input data launching and output data capturing. The test patterns come from a scan path that is configured into a linear feedback shift register (LFSR) 404. The test data is then outputted into the multiple input shift register (MISR) 406 for data compression. Channel weighting logic 408 enables the performance of weighted self test patterns.

Figure 1:
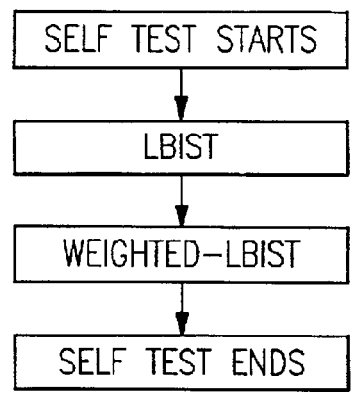
FIG. 1 is a schematic diagram illustrating a prior art LBIST/weighted LBIST process.

During either LBIST and weighted LBIST tests, alternate scan path shift cycles are applied to the SRLs exercising the combinational logic with the contents of the SRLs and capturing the results of the response of the combinational logic back into the SRLs where they are used as the test inputs for the next cycle. At the end of the requisite number of cycles the contents of the scan path is read out as the signature to be compared with the desired value. The use of pseudo random test patterns in this manner generally ensures that the circuit chip will operate properly, but the applied test patterns do not properly test all logic paths on the chip. In the past, to increase the application of the testing procedure to more logic paths, the LBIST test has been followed by the weighted LBIST test as shown in FIG. 1. The above mentioned Molika et al patent describes the weighting structures used in weighted LBIST testing. As pointed out above, as operational speed and circuit density of chips have increased, heating of the circuit elements during LBIST testing has become a serious problem. In LBIST testing, chips are run at 1.2 times their rated operational speed to assure proper operation.

Figure 5:
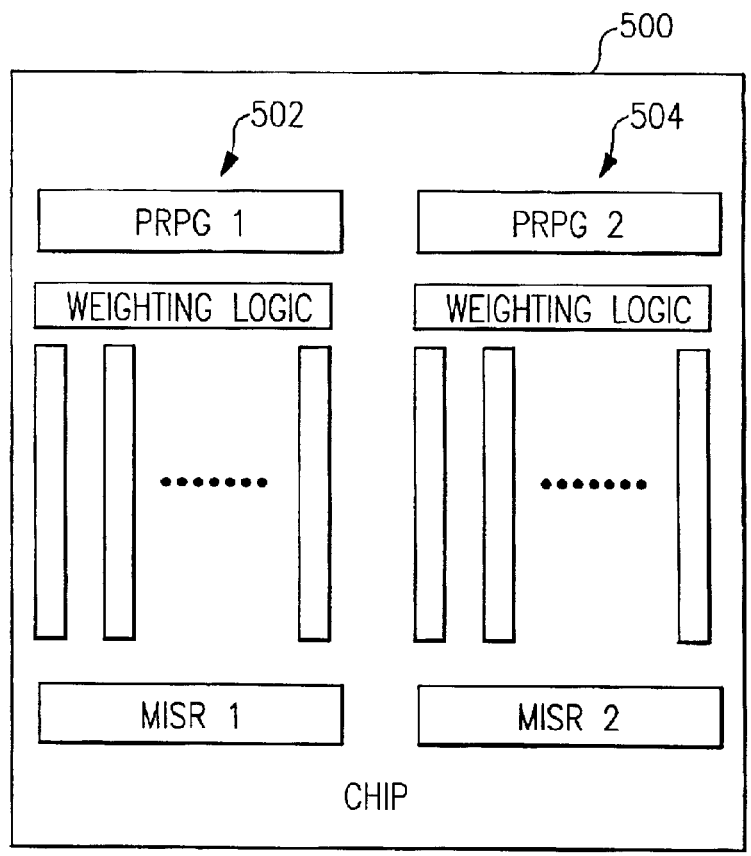
FIG. 5 is a diagram of a circuit chip for performance of LBIST tests in accordance with the present invention.
Figure 6:
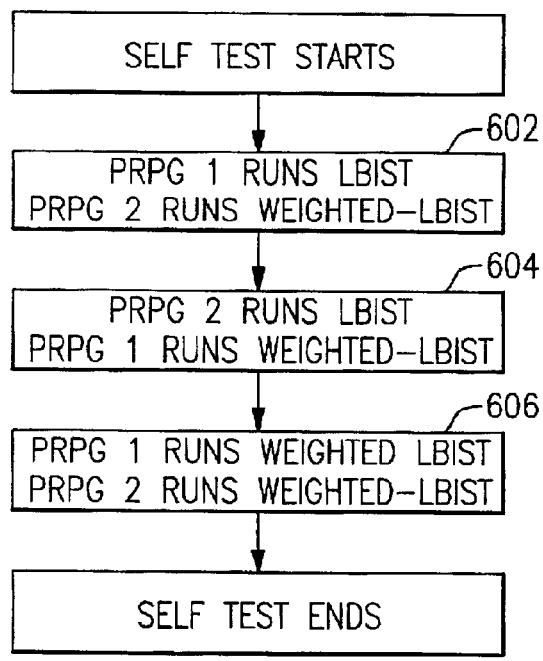
FIG. 6 is a flow diagram of computer testing of the chip of FIG. 5 in accordance with the present invention.

In accordance with the present invention, heating of the tested object is reduced. The LBIST and weighted LBIST tests are scheduled differently than that shown in FIG. 1 to reduce power consumption levels while the time it takes to perform the tests and the energy used remains the same. The invention is applicable at the chip multi chip module, and system levels of testing. As shown in FIG. 5, a circuit chip 500 is provided with multiple cores and each core contains its own LBIST test structure like the one shown in FIG. 4. As shown in FIG. 6, as one test structure 502 runs the LBIST test using the flat pseudo-random test pattern, the other test structure 504 runs the weighted LBIST test using the weighted LBIST test patterns (step 602) are tested using LBIST testing patterns while the others are using weighted LBIST under the power constraints. After that, the flat pseudo-random LBIST test patterns are applied to the test structure 504, that have been previously tested using the weighted LBIST test patterns, and the weighted LBIST test patterns are applied to the structure 502 that have been previously tested using flat LBIST test patterns. During steps 602 and 604, the weighted LBIST test patterns are selected to maintain power levels below the desired maximum level. Thereafter, weighted LBIST with different weights can be applied simultaneously to both list structures 502 and 504 of the chip (step 606). This approach takes the advantage of lower power consumption during weighted LBIST were much less switching activities occur during test.

This test methodology will guarantee the test coverage and has no impact on test time. But the power consumption will be reduced dramatically. Roughly, average a 30%–40% power reduction can be achieved depending on which weight is chosen and an assumption of half of the total cores running LBIST and the other half running weighted LBIST. More power reduction is achievable if more cores are used and, at any given time, less cores run LBIST using the flat pseudo-random patterns while more cores run weighted LBIST using the weighted test patterns.

In any case, the average power can be calculated as follows:

$$P = \tfrac{1}{2} * V_{dd}^2 * f_{clk} * (A_1*C_1 + A_2*C_2 + \ldots + A_n*C_n)$$

where: $V_{dd}$ is the power supply voltage; $f_{clk}$, the clock frequency; $A_1, A_2 \ldots A_n$, are the average number of transitions (switching factor) per clock cycle on net I through n, and $C_1, C_2 \ldots C_n$, are the capacitances of net I through n.

Assuming the above described two core design where one core runs LBIST and the other run weighted LBIST. For the LBIST test using a flat random pattern, assume the average power consumption is 1 (0.5 for each core). For weighted LBIST test, assume the other core runs 1/16 the LBIST flat pseudo pattern 0.5×1/8. Then the total average power for the present methodology is 0.5+0.5×1/8=0.5625. Therefore, more than a 40% power reduction is achieved.

Figure 7:
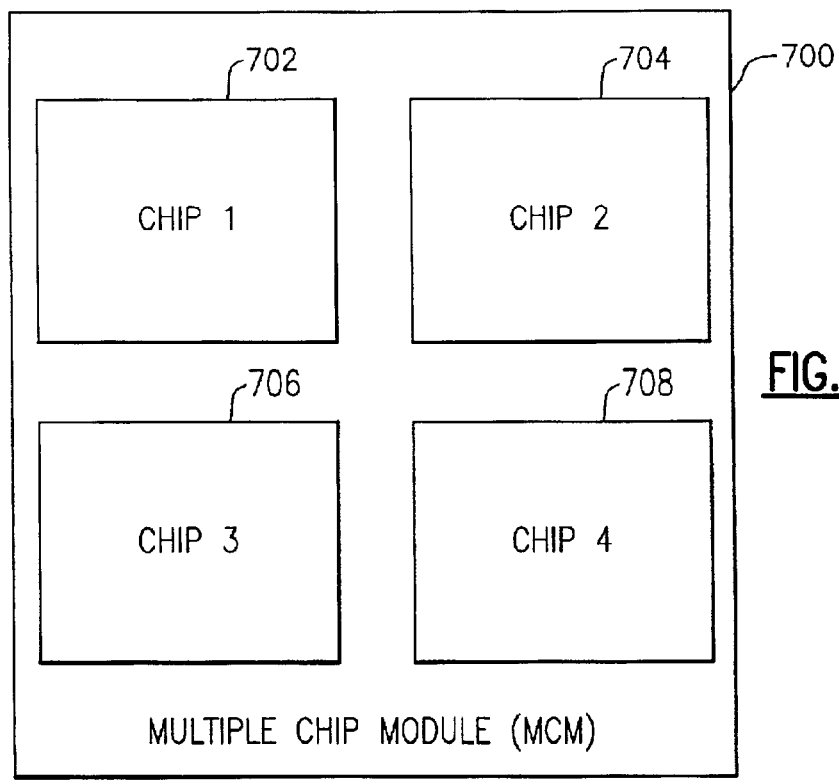
FIG. 7 is a diagram of a multi-chip module.
Figure 8:
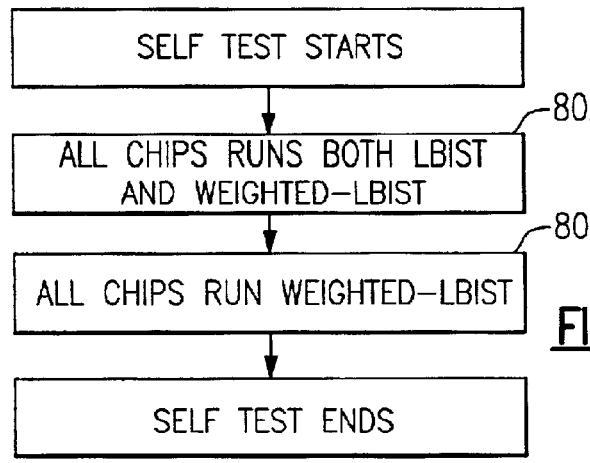
FIG. 8 is a flow diagram of computer testing of the module of FIG. 7 in accordance with the present invention.

As shown in FIGS. 7 and 8, the present invention can be used in testing a multichip module (MCM) 700 where some of the chips 702 to 708 run flat LBIST test patterns while others run weighted LBIST test patterns. In step 802 of FIG. 8, all 4 chips are tested as described in connection with steps 602 and 604 of FIG. 6. Then in step 804, all chips run weighted LBIST tests as described in connection with step 606 of FIG. 6. Therefore, power consumption can be reduced at all levels of self test. Another factor of the power reduction using this method occurs during pattern scanning where much less switching activity occurs than during the standard LBIST method.

The above testing procedure provides

1. No impact on test time;
2. No impact on fault coverage;
3. No new requirement on tool support;
4. Compatible with existing structural LBIST base (STUMPS);
5. Implementation is relatively simple and requires low circuit overhead.

Figure 9:
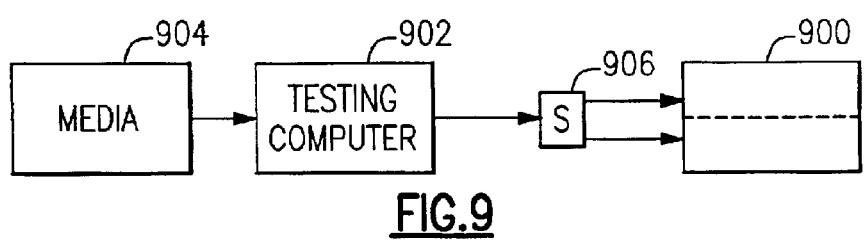
FIG. 9 is a block diagram of a computer testing set up.

As shown in FIG. 9, the testing algorithm to test a chip 900 can be provided to the testing computer 902 on magnetic or optical media 904. A simple control logic switch 906 is provided to respond to separate control signals for LBIST and weighted LBIST tests. Usually these signals come from the scannable General Purpose Test Register (GPTR) latches.

Above one embodiment of the invention has been described. However, it should be understood that the invention is not limited to the disclosed embodiment but includes all changes that can be made in that embodiment without departing from the spirit and scope of the appended claims.

We claim:

1. A method of testing a combinational and sequential logic circuit with shift register latches of individual logic units coupled together to form a shift register scan path for testing logic circuits and uncoupled to disable the scan path while the logic circuit is performing its designed logic function, a method for reducing the heating of the circuit elements during testing comprising:

(a) dividing the circuits at least into two group cores;
    (b) performing simulation testing by shifting a plurality of pseudo random pulse patterns through at least one of the cores to detect faults in said at least one of the cores;
    (c) simultaneously performing simulation testing in other of said at least two cores using a weighted pseudo-random pulse pattern with the weighting selected to maintain the heating of the circuits below acceptable limits; and
    (d) changing switching the cores subjected to the testing of the pseudo-random and the weighted pseudo-random test patterns so that pseudo-random and weighted pseudo-random test patterns are applied to all cores.

2. The method of claim 1, wherein said cores are on a single circuit chip.

3. The method of claim 2, wherein said circuit chip each of the cores contain the circuits of the core connected for self testing to a pseudo-random pattern generator and data compression means capable of providing the pseudo-random and the weighted pseudo-random patterns separately to each core.

4. The method of claim 3, wherein there are a plurality of circuit chips capable of self testing and on a single module.

5. The method of claim 4 the module is tested by subjecting at least one of the circuit chips to the pseudo-random self test patterns while others of the chips are subjected to the weighted pseudo-random pattern.

6. The method of claim 1, wherein each of the cores is a chip on a module.

7. A computer program on a computer useable medium for testing a combinational and sequential logic circuit with shift register latches of individual logic units coupled together to form a shift register scan path for testing logic circuits and uncoupled to disable the scan path while the logic circuit is performing its designed logic function, a method for reducing the heating of the circuit elements during testing comprising:

(a) software for dividing the circuits at least into two group cores;
    (b) software for performing simulation testing by shifting a plurality of pseudo random pulse patterns through at least one of the cores to detect faults in said at least one of the cores;
    (c) software for simultaneously performing simulation testing in other of said at least two cores using a weighted pseudo-random pulse pattern with the weighting selected to maintain the heating of the circuits below acceptable limits; and
    (d) software for changing switching the cores subjected to the testing of the pseudo-random and the weighted pseudo-random test patterns so that pseudo-random and weighted pseudo-random test patterns are applied to all cores.

8. The computer program of claim 7, wherein said cores are on a single circuit chip.

9. The computer program of claim 8, wherein said circuit chip each of the cores contain the circuits of the core connected for self testing to a pseudo-random pattern generator and data compression means capable of providing the pseudo-random and the weighted pseudo-random patterns separately to each core.

10. The computer program of claim 9, wherein there are a plurality of circuit chips capable of self testing and on a single module.

11. The computer program of claim 10, wherein the module is tested by subjecting at least one of the circuit chips to the pseudo-random self test patterns while others of the chips are subjected to the weighted pseudo-random pattern.

12. The computer program of claim 11, wherein each of the cores is a chip on a module.

* * * * *